United States Patent
Ishiwata et al.

(10) Patent No.: US 11,888,005 B2
(45) Date of Patent: *Jan. 30, 2024

(54) SOLID-STATE IMAGING DEVICE, MANUFACTURING METHOD THEREOF, AND CAMERA WITH ALTERNATIVELY ARRANGED PIXEL COMBINATIONS

(71) Applicant: Sony Semiconductor Solutions Corporation, Kanagawa (JP)

(72) Inventors: Hiroaki Ishiwata, Tokyo (JP); Sanghoon Ha, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/182,291

(22) Filed: Mar. 10, 2023

(65) Prior Publication Data

US 2023/0207591 A1    Jun. 29, 2023

Related U.S. Application Data

(63) Continuation of application No. 17/549,212, filed on Dec. 13, 2021, now Pat. No. 11,605,660, which is a (Continued)

(30) Foreign Application Priority Data

Jul. 24, 2009   (JP) ................... 2009-173127

(51) Int. Cl.
*H01L 27/146*   (2006.01)
*H04N 25/75*   (2023.01)
(Continued)

(52) U.S. Cl.
CPC .. *H01L 27/14621* (2013.01); *H01L 27/14607* (2013.01); *H01L 27/14609* (2013.01);
(Continued)

(58) Field of Classification Search
CPC ...... H04N 25/134; H04N 25/75; H04N 25/76; H04N 25/77; H04N 2209/045;
(Continued)

(56) References Cited

U.S. PATENT DOCUMENTS 6,999,119 B1   2/2006  Shibazaki et al.
8,243,146 B2   8/2012  Kikuchi
(Continued)

FOREIGN PATENT DOCUMENTS

JP   58-175372 A   10/1983
JP   02-210996 A    8/1990
(Continued)

OTHER PUBLICATIONS

Japanese Office Action and English translation thereof dated Dec. 24, 2014 for corresponding Japanese Application No. 2014-021783.
(Continued)

*Primary Examiner* — Kelly L Jerabek
(74) *Attorney, Agent, or Firm* — Wolf, Greenfield & Sacks, P.C.

(57) ABSTRACT

A solid-state imaging device includes a semiconductor substrate; and a pixel unit having a plurality of pixels on the semiconductor substrate, wherein the pixel unit includes first pixel groups having two or more pixels and second pixel groups being different from the first pixel groups, wherein a portion of the pixels in the first pixel groups and a portion of the pixels in the second pixel groups share a floating diffusion element.

20 Claims, 14 Drawing Sheets

Related U.S. Application Data continuation of application No. 17/114,071, filed on Dec. 7, 2020, now Pat. No. 11,233,083, which is a continuation of application No. 16/791,681, filed on Feb. 14, 2020, now Pat. No. 10,896,924, which is a continuation of application No. 16/204,313, filed on Nov. 29, 2018, now Pat. No. 10,692,909, which is a continuation of application No. 16/045,927, filed on Jul. 26, 2018, now Pat. No. 10,249,663, which is a continuation of application No. 15/425,420, filed on Feb. 6, 2017, now Pat. No. 10,062,719, which is a continuation of application No. 14/971,666, filed on Dec. 16, 2015, now Pat. No. 9,793,313, which is a continuation of application No. 14/586,208, filed on Dec. 30, 2014, now Pat. No. 9,245,918, which is a continuation of application No. 14/175,289, filed on Feb. 7, 2014, now Pat. No. 8,976,283, which is a continuation of application No. 13/886,704, filed on May 3, 2013, now Pat. No. 8,704,921, which is a continuation of application No. 12/834,571, filed on Jul. 12, 2010, now Pat. No. 8,446,498.

(51) Int. Cl.
 H04N 25/76 (2023.01)
 H04N 25/77 (2023.01)
 H04N 25/13 (2023.01)

(52) U.S. Cl.
 CPC .. *H01L 27/14612* (2013.01); *H01L 27/14625* (2013.01); *H01L 27/14627* (2013.01); *H01L 27/14645* (2013.01); *H01L 27/14685* (2013.01); *H04N 25/134* (2023.01); *H04N 25/75* (2023.01); *H04N 25/76* (2023.01); *H04N 25/77* (2023.01); *H04N 2209/045* (2013.01)

(58) Field of Classification Search
 CPC ......... H01L 27/14621; H01L 27/14607; H01L 27/14609; H01L 27/14612; H01L 27/14625; H01L 27/14627; H01L 27/14645; H01L 27/14685
 See application file for complete search history.

(56) References Cited

U.S. PATENT DOCUMENTS

| | | | |
|---|---|---|---|
| 8,446,498 B2 | 5/2013 | Ishiwata et al. | |
| 8,704,921 B2 | 4/2014 | Ishiwata et al. | |
| 8,976,283 B2 | 3/2015 | Ishiwata et al. | |
| 9,245,918 B2 | 1/2016 | Ishiwata et al. | |
| 9,793,313 B2 | 10/2017 | Ishiwata et al. | |
| 10,062,719 B2 | 8/2018 | Ishiwata et al. | |
| 10,068,939 B2 | 9/2018 | Ishiwata et al. | |
| 10,249,663 B2 | 4/2019 | Ishiwata et al. | |
| 10,692,909 B2 | 6/2020 | Ishiwata et al. | |
| 10,770,495 B1 | 9/2020 | Ishiwata et al. | |
| 10,896,924 B2 | 1/2021 | Ishiwata et al. | |
| 11,233,083 B2 | 1/2022 | Ishiwata et al. | |
| 11,605,660 B2 * | 3/2023 | Ishiwata | H01L 27/14609 |
| 2004/0004668 A1 | 1/2004 | Namazue et al. | |
| 2004/0100570 A1 | 5/2004 | Shizukuishi | |
| 2005/0134699 A1 | 6/2005 | Nagashima et al. | |
| 2006/0220025 A1 | 10/2006 | Oh | |
| 2007/0014019 A1 | 1/2007 | Mouli | |
| 2007/0153337 A1 | 7/2007 | Kim | |
| 2007/0194356 A1 | 8/2007 | Moon et al. | |
| 2007/0273772 A1 | 11/2007 | Shirai | |
| 2008/0074518 A1 | 3/2008 | Beck et al. | |
| 2008/0142856 A1 | 6/2008 | Sato et al. | |
| 2008/0180555 A1 | 7/2008 | Sato et al. | |
| 2008/0197387 A1 | 8/2008 | Itonaga et al. | |
| 2008/0316346 A1 | 12/2008 | Watanabe | |
| 2009/0002531 A1 | 1/2009 | Godaiin | |
| 2009/0008687 A1 | 1/2009 | Katsuno et al. | |
| 2009/0090937 A1 | 4/2009 | Park | |
| 2009/0147101 A1 | 6/2009 | Tatani et al. | |
| 2009/0173974 A1 | 7/2009 | Shah et al. | |
| 2009/0200451 A1 | 8/2009 | Conners | |
| 2009/0278967 A1 | 11/2009 | Toumiya | |
| 2009/0280596 A1 | 11/2009 | Akiyama | |
| 2009/0290039 A1 | 11/2009 | Kanamori et al. | |
| 2009/0321865 A1 | 12/2009 | Kasano et al. | |
| 2010/0002117 A1 | 1/2010 | Iwane et al. | |
| 2010/0200738 A1 | 8/2010 | Yamashita | |
| 2010/0321616 A1 | 12/2010 | Ha et al. | |
| 2011/0019041 A1 | 1/2011 | Ishiwata et al. | |
| 2011/0108938 A1 | 5/2011 | Nozaki et al. | |
| 2012/0025060 A1 | 2/2012 | Iwata | |
| 2013/0250153 A1 | 9/2013 | Ishiwata et al. | |
| 2014/0152881 A1 | 6/2014 | Ishiwata et al. | |
| 2015/0115385 A1 | 4/2015 | Ishiwata et al. | |
| 2016/0181304 A1 | 6/2016 | Ishiwata et al. | |
| 2017/0148835 A1 | 5/2017 | Ishiwata et al. | |
| 2017/0148836 A1 | 5/2017 | Ishiwata et al. | |
| 2017/0150082 A1 | 5/2017 | Ui | |
| 2018/0358395 A1 | 12/2018 | Ishiwata et al. | |
| 2019/0096940 A1 | 3/2019 | Ishiwata et al. | |
| 2020/0185442 A1 | 6/2020 | Ishiwata et al. | |
| 2020/0295067 A1 | 9/2020 | Ishiwata et al. | |
| 2021/0091132 A1 | 3/2021 | Ishiwata et al. | |
| 2022/0102408 A1 | 3/2022 | Ishiwata et al. | |

FOREIGN PATENT DOCUMENTS

| | | |
|---|---|---|
| JP | 05-243543 A | 9/1993 |
| JP | 2000-069491 A | 3/2000 |
| JP | 2004-186311 A | 7/2004 |
| JP | 2004-221532 A | 8/2004 |
| JP | 2006-032913 A | 2/2006 |
| JP | 2008-113171 A | 5/2008 |
| JP | 2008-172091 A | 7/2008 |
| JP | 2008-294218 A | 12/2008 |
| JP | 2011-029379 A | 2/2011 |

OTHER PUBLICATIONS

U.S. Appl. No. 12/834,571, filed Jul. 12, 2010, Ishiwata et al.
U.S. Appl. No. 13/886,704, filed May 3, 2013, Ishiwata et al.
U.S. Appl. No. 14/175,289, filed Feb. 7, 2014, Ishiwata et al.
U.S. Appl. No. 14/586,208, filed Dec. 30, 2014, Ishiwata et al.
U.S. Appl. No. 14/971,666, filed Dec. 16, 2015, Ishiwata et al.
U.S. Appl. No. 15/424,650, filed Feb. 3, 2017, Ishiwata et al.
U.S. Appl. No. 15/425,420, filed Feb. 6, 2017, Ishiwata et al.
U.S. Appl. No. 16/045,927, filed Jul. 26, 2018, Ishiwata et al.
U.S. Appl. No. 16/204,313, filed Nov. 29, 2018, Ishiwata et al.
U.S. Appl. No. 16/791,681, filed Feb. 14, 2020, Ishiwata et al.
U.S. Appl. No. 16/890,844, filed Jun. 2, 2020, Ishiwata et al.
U.S. Appl. No. 17/114,071, filed Dec. 7, 2020, Ishiwata et al.
U.S. Appl. No. 17/549,212, filed Dec. 13, 2021, Ishiwata et al.

* cited by examiner

SOLID-STATE IMAGING DEVICE, MANUFACTURING METHOD THEREOF, AND CAMERA WITH ALTERNATIVELY ARRANGED PIXEL COMBINATIONS

CROSS-REFERENCES TO RELATED APPLICATIONS

This application is a continuation of and claims the benefit under 35 U.S.C. § 120 of U.S. Patent application Ser. No. 17/549,212, filed on Dec. 13, 2021, now U.S. Patent Ser. No. 11,605,660, which is a continuation of and claims the benefit under 35 U.S.C. § 120 of U.S. patent application Ser. No. 17/114,071, filed on Dec. 7, 2020, now U.S. Pat. No. 11,233,083, which is a continuation of U.S. patent application Ser. No. 16/791,681, filed on Feb. 14, 2020, now U.S. Pat. No. 10,896,924, which is a continuation of U.S. patent application Ser. No. 16/204,313, filed on Nov. 29, 2018, now U.S. Pat. No. 10,692,909, which is a continuation of U.S. patent application Ser. No. 16/045,927, filed on Jul. 26, 2018, now U.S. Patent No. 10,249,663, which is a continuation of U.S. patent application Ser. No. 15/425,420, filed on Feb. 6, 2017, now U.S. Pat. No. 10,062,719, which is a continuation of U.S. patent application Ser. No. 14/971,666, filed on Dec. 16, 2015, now U.S. Pat. No. 9,793,313, which is a continuation of U.S. patent application Ser. No. 14/586,208, filed on Dec. 30, 2014, now U.S. Pat. No. 9,245,918, which is a continuation of U.S. patent application Ser. No. 14/175,289, filed on Feb. 7, 2014, now U.S. Pat. No. 8,976,283, which is a continuation of U.S. patent application Ser. No. 13/886,704, filed on May 3, 2013, now U.S. Pat. No. 8,704,921, which is a continuation of U.S. patent application Ser. No. 12/834,571, filed on Jul. 12, 2010, now U.S. Pat. No. 8,446,498, which claims priority to Japanese Patent Application JP 2009-173127, filed with the Japan Patent Office on Jul. 24, 2009. The entire contents of each of these applications is hereby incorporated by reference in their entireties.

BACKGROUND OF THE INVENTION

1. Field of the Invention

The present invention relates to a solid-state imaging device, a manufacturing method thereof, and a camera, and particularly to a solid-state imaging device in which pixels having photodiodes on the light sensing surfaces thereof are arranged in a matrix shape, a manufacturing method thereof, and a camera which includes the solid-state imaging device.

2. Description of the Related Art

There has been a problem that in a solid-state imaging device, it becomes more difficult to efficiently transmit the incident light to a photoelectric converting unit as the pixel size is reduced, which results in lowering the sensitivity.

In order to solve this problem, Japanese Unexamined Patent Application Publication No. 2004-221532 proposed a technique in which an optical waveguide was provided above a light sensing unit and below an on-chip lens (OCL) in one pixel in order to reduce a light propagation loss.

The Bayer arrangement has been known widely as a color filter arrangement for pixels of the solid-state imaging device.

For example, the OCL is formed for each pixel, and the optical waveguide is formed between the photodiode and the OCL for each pixel. In addition, each pixel has the photodiode with a same area.

In the solid-state imaging device with the above-described configuration, the shape of the OCL is the same as that of the optical waveguide for the pixels with respective colors of the color filters.

In addition, a configuration in which the shape of the OCL is changed for each color of the color filter has been also known as disclosed in Japanese Unexamined Patent Application Publication No. 2008-172091.

Since the CMOS process which has high affinity with a logic circuit is employed in the CMOS image sensor, there is an advantage in that a peripheral circuit such as a digital signal processor can be mounted on a same semiconductor chip.

The peripheral circuit has been devised in order to reduce its occupying area as much as possible by using a multi-layer wiring, such as a four-layer wiring.

If the number of the wiring layers is increased for the pixels along with the numbers of those for the peripheral circuit, the distance between the semiconductor substrate on which the photodiodes (PD) are formed and the OCL becomes longer, which may lower the light collection efficiency.

In addition, with regard to a camera module for a mobile phone, it is necessary to lower the height of the module in order to downsize the entire size and the thickness of the mobile phone.

For this expectation, the angle of a light beam, which is incident to the periphery of the angle of view of the mounted image sensor, tends to be wider.

If the obliquely incident light in the periphery of the angle of view is not efficiently guided to the photodiodes, there may occur a great difference in the sensitivities between the periphery of the angle of view and the center of the angle of view, which results in a so-called shading which is the deterioration in the pixel characteristic.

Generally, in the formation of the color filters, the color filters of adjacent pixels may possibly overlap with each other if the color arrangements are different in the adjacent pixels. The overlapped portion blocks the light transmission, and becomes a non-effective region.

Specifically, when the adjacent pixels of the green pixel (G) are the red pixel (R) and the blue pixel (B) in the Bayer arrangement, the color filters for G and B and the color filters for G and R are respectively overlapped in the adjacent parts, and the overlapped portions become non-effective regions.

In addition, if the opening of the optical waveguide becomes smaller, the light collection effect may possibly be lowered.

In Japanese Unexamined Patent Application Publication Nos. 58-175372, 2000-69491, and 5-243543, for example, there are descriptions of solid-state imaging devices in each of which pixels with photodiodes provided on their light sensing surfaces are arranged in a matrix shape.

SUMMARY OF THE INVENTION

As described above, there has been a problem that the overlapping of the color filters causes non-effective regions in the solid-state imaging device such as the CMOS image sensor in the related art.

A solid-state imaging device according to an embodiment of the present invention includes: photodiodes which are formed separately for each pixel arranged in a matrix shape on a light sensing surface of a semiconductor substrate; a signal reading unit which is formed on the semiconductor substrate and reads a signal charge generated and charged in the photodiodes or a voltage in accordance with the signal charge; an insulating film which is formed on the semiconductor substrate so as to cover the photodiodes and includes optical waveguides; color filters which are formed on the insulating film; and on-chip lenses which are formed on the color filters. In addition, in a layout, first pixel combinations and second pixel combinations are alternately arranged both in horizontal and vertical directions, each of the first pixel combinations having a layout in which two green pixels are arranged both in horizontal and vertical directions and a total of four pixels are arranged while provided with a green color filter as their color filter, each of the second pixel combinations having a layout in which two pixels are arranged both in the horizontal and vertical directions, a total of four pixels are arranged, and two red pixels having red color filters and two blue pixels having blue color filters are arranged cater cornered.

In the above solid-state imaging device, the photodiodes are formed separately for each pixel arranged in a matrix shape on the light sensing surface of a semiconductor substrate, and the signal reading unit which reads a signal charge generated and charged in the photodiodes or a voltage in accordance with the signal charge is formed on the semiconductor substrate. In addition, the insulating film including the optical waveguides is formed on the semiconductor substrate so as to cover the photodiodes, the color filters are formed on the insulating film, and the on-chip lenses are formed on the color filters.

Here, in the layout of the color filters, the first pixel combinations and the second pixel combinations are alternately arranged both in horizontal and vertical directions, the first pixel combination having a layout in which two green pixels are arranged both in the horizontal and vertical directions and a total of four pixels are arranged while provided with a green color filter as their color filter, the second pixel combination having a layout in which two pixels are arranged both in the horizontal and vertical directions, a total of four pixels are arranged, and two red pixels having red color filters and two blue pixels having blue color filters are arranged cater cornered.

In addition, a solid-state imaging device according to another embodiment of the present invention includes: photodiodes which are formed separately for each pixel arranged in a matrix shape on a light sensing surface of a semiconductor substrate; a signal reading unit which is formed on the semiconductor substrate and reads a signal charge generated and charged in the photodiodes or a voltage in accordance with the signal charge; an insulating film which is formed on the semiconductor substrate so as to cover the photodiodes and includes optical waveguides; color filters which are formed on the insulating film; and on-chip lenses which are formed on the color filters. Here, the color filters include first pixel combinations in each of which two green pixels are arranged both in the horizontal and vertical directions and a total of four pixels are arranged while provided with a green color filter as their color filter, second pixel combinations in each of which two blue pixels are arranged both in the horizontal and vertical directions and a total of four pixels are arranged while provided with a blue color filter as their color filter, and third pixel combinations in each of which two red pixels are arranged both in the horizontal and vertical directions and a total of four pixels are arranged while provided with a red color filter as their color filter. Moreover, in a layout, fourth pixel combinations, in each of which the first pixel combinations and the second pixel combinations are alternately arranged in the horizontal direction, and fifth pixel combinations, in each of which the first pixel combinations and the third pixel combinations are alternately arranged in the horizontal direction, are alternately arranged in the vertical direction so as to shift by the amount of the first pixel combination in the horizontal direction. Furthermore, one on-chip lens is formed for each of the first pixel combination, the second pixel combination, and the third pixel combination as the on-chip lens.

In the above solid-state imaging device, the photodiodes are formed separately for each pixel arranged in a matrix shape on the light sensing surface of a semiconductor substrate, and the signal reading unit which reads a signal charge generated and charged in the photodiodes or a voltage in accordance with the signal charge is formed on the semiconductor substrate. In addition, the insulating film including the optical waveguides is formed on the semiconductor substrate so as to cover the photodiodes, the color filters are formed on the insulating film, and the on-chip lenses are formed on the color filters.

Here, the color filters include the first pixel combinations in each of which two green pixels are arranged both in the horizontal and vertical directions and a total of four pixels are arranged while provided with a green color filter as their color filter, the second pixel combinations in each of which two blue pixels are arranged both in the horizontal and vertical directions and a total of four pixels are arranged while provided with a blue color filter as their color filter, and the third pixel combinations in each of which two red pixels are arranged both in the horizontal and vertical directions and a total of four pixels are arranged while provided with a red color filter as their color filter. Moreover, in a layout, the fourth pixel combinations, in each of which the first pixel combinations and the second pixel combinations are alternately arranged in the horizontal direction, and the fifth pixel combinations, in each of which the first pixel combinations and the third pixel combinations are alternately arranged in the horizontal directions, are alternately arranged in the vertical direction so as to shift by the amount of the first pixel combination in the horizontal direction.

Furthermore, one on-chip lens is formed for each of the first pixel combination, the second pixel combination, and the third pixel combination as the on-chip lens.

A method of manufacturing a solid-state imaging device according to an embodiment of the present invention includes the steps of: forming photodiodes separately for each pixel arranged in a matrix shape on a light sensing surface of a semiconductor substrate and a signal reading unit for reading a signal charge generated and charged in the photodiodes or a voltage in accordance with the signal charge; forming an insulating film including optical waveguides on the semiconductor substrate so as to cover the photodiodes; forming color filters on the insulating film; and forming on-chip lenses on the color filters. Here, in the step of forming the color filters, a layout in which the first pixel combinations and the second pixel combinations are alternately arranged both in the horizontal and vertical directions is employed, the first pixel combination having a layout in which two green pixels are arranged both in the horizontal and vertical directions and a total of four pixels are arranged while provided with a green color filter as their color filter, the second pixel combination having a layout in which two pixels are arranged both in the horizontal and vertical directions, a total of four pixels are arranged, and two red pixels having red color filters and two blue pixels having blue color filters are arranged cater cornered.

In the above method of manufacturing the solid-state imaging device, the photodiodes are formed separately for each pixel arranged in a matrix shape on the light sensing surface of a semiconductor substrate, and the signal reading unit which reads a signal charge generated and charged in the photodiodes or a voltage in accordance with the signal charge is formed on the semiconductor substrate. Next, the insulating film including the optical waveguides is formed on the semiconductor substrate so as to cover the photodiodes, the color filters are formed on the insulating film, and the on-chip lenses are formed on the color filters.

Here, in the step of forming the color filters, a layout in which the first pixel combinations and the second pixel combinations are alternately arranged both in the horizontal and vertical directions is employed, the first pixel combination having a layout in which two green pixels are arranged both in the horizontal and vertical directions and a total of four pixels are arranged while provided with a green color filter as their color filter, the second pixel combination having a layout in which two pixels are arranged both in the horizontal and vertical directions, a total of four pixels are arranged, and two red pixels having red color filters and two blue pixels having blue color filters are arranged cater cornered.

In addition, a method of manufacturing a solid-state imaging device according to an embodiment of the present invention includes the steps of: forming photodiodes separately for each pixel arranged in a matrix shape on a light sensing surface of a semiconductor substrate and a signal reading unit for reading a signal charge generated and charged in the photodiodes or a voltage in accordance with the signal charge; forming an insulating film including optical waveguides on the semiconductor substrate so as to cover the photodiodes; forming color filters on the insulating film; and forming on-chip lenses on the color filters. Here, in the step of forming the color filters, the color filters include first pixel combinations, in each of which two green pixels are arranged both in the horizontal and vertical directions and a total of four pixels are arranged while provided with a green color filter as their color filter, second pixel combinations, in each of which two blue pixels are arranged both in the horizontal and vertical directions and a total of four pixels are arranged while provided with a blue color filter as their color filter, and third pixel combinations, in each of which two red pixels are arranged both in the horizontal and vertical directions and a total of four pixels are arranged while provided with a red color filter as their color filter. In addition, in a layout, fourth pixel combinations, in each of which the first pixel combinations and the second pixel combinations are alternately arranged in the horizontal direction, and fifth pixel combinations, in each of which the first pixel combinations and the third pixel combinations are alternately arranged in the horizontal direction, are alternately arranged in the vertical direction so as to shift by the amount of the first pixel combination in the horizontal direction. Moreover, in the step of forming the on-chip lens, one on-chip lens is formed for each of the first pixel combination, the second pixel combination, and the third pixel combination as the on-chip lens.

In the above method of manufacturing the solid-state imaging device, the photodiodes are formed separately for each pixel arranged in a matrix shape on the light sensing surface of a semiconductor substrate, and the signal reading unit which reads a signal charge generated and charged in the photodiodes or a voltage in accordance with the signal charge is formed on the semiconductor substrate. Next, the insulating film including the optical waveguides is formed on the semiconductor substrate so as to cover the photodiodes, the color filters are formed on the insulating film, and the on-chip lenses are formed on the color filters.

Here, in the step of forming the color filters, the color filters include first pixel combinations, in each of which two green pixels are arranged both in the horizontal and vertical directions and a total of four pixels are arranged while provided with a green color filter as their color filter, second pixel combinations, in each of which two blue pixels are arranged both in the horizontal and vertical directions and a total of four pixels are arranged while provided with a blue color filter as their color filter, and third pixel combinations, in each of which two red pixels are arranged both in the horizontal and vertical directions and a total of four pixels are arranged while provided with a red color filter as their color filter. In addition, in a layout, fourth pixel combinations, in each of which the first pixel combinations and the second pixel combinations are alternately arranged in the horizontal direction, and fifth pixel combinations, in each of which the first pixel combinations and the third pixel combinations are alternately arranged in the horizontal direction, are alternately arranged in the vertical direction so as to shift by the amount of the first pixel combination in the horizontal direction.

Moreover, in the step of forming the on-chip lens, one on-chip lens is formed for each of the first pixel combination, the second pixel combination, and the third pixel combination as the on-chip lens.

A camera according to an embodiment of the present invention includes: a solid-state imaging device in which a plurality of pixels are integrated on a light sensing surface; an optical system which guides incident light to an imaging unit of the solid-state imaging device; and a signal processing circuit which processes output signals of the solid-state imaging device. Here, the solid-state imaging device includes photodiodes which are formed separately for each pixel arranged in a matrix shape on a light sensing surface of a semiconductor substrate, a signal reading unit which is formed on the semiconductor substrate and reads a signal charge generated and charged in the photodiodes or a voltage in accordance with the signal charge, an insulating film which is formed on the semiconductor substrate so as to cover the photodiodes and includes optical waveguides, color filters which are formed on the insulating film, and on-chip lenses which are formed on the color filters. In addition, in a layout of the color filters, first pixel combinations and second pixel combinations are alternately arranged both in the horizontal and vertical directions, the first pixel combination having a layout in which two green pixels are arranged both in the horizontal and vertical directions and a total of four pixels are arranged while provided with a green color filter as their color filter, the second pixel combination having a layout in which two pixels are arranged both in the horizontal and vertical directions, a total of four pixels are arranged, and two red pixels having red color filters and two blue pixels having blue color filters are arranged cater cornered.

In addition, a camera according to an embodiment of the present invention includes: a solid-state imaging device in which a plurality of pixels are integrated on a light sensing surface; an optical system which guides incident light to an imaging unit of the solid-state imaging device; and a signal processing circuit which processes output signals of the solid-state imaging device. Here, the solid-state imaging device includes photodiodes which are formed separately for each pixel arranged in a matrix shape on a light sensing surface of a semiconductor substrate, a signal reading unit which is formed on the semiconductor substrate and reads a signal charge generated and charged in the photodiodes or a voltage in accordance with the signal charge, an insulating film which is formed on the semiconductor substrate so as to cover the photodiodes and includes optical waveguides, color filters which are formed on the insulating film, and on-chip lenses which are formed on the color filters. In addition, color filters include first pixel combinations in each of which two green pixels are arranged both in the horizontal and vertical directions and a total of four pixels are arranged while provided with a green color filter as their color filter, second pixel combinations in each of which two blue pixels are arranged both in the horizontal and vertical directions and a total of four pixels are arranged while provided with a blue color filter as their color filter, and third pixel combinations in each of which two red pixels are arranged both in the horizontal and vertical directions and a total of four pixels are arranged while provided with a red color filter as their color filter. Moreover, in a layout, fourth pixel combinations, in each of which the first pixel combinations and the second pixel combinations are alternately arranged in the horizontal direction, and fifth pixel combinations, in each of which the first pixel combinations and the third pixel combinations are alternately arranged in the horizontal direction, are alternately arranged in the vertical direction so as to shift by the amount of the first pixel combination in the horizontal direction. Furthermore, one on-chip lens is formed for each of the first pixel combination, the second pixel combination, and the third pixel combination as the on-chip lens.

The above-described camera includes a solid-state imaging device in which a plurality of pixels are integrated on a light sensing surface; an optical system which guides incident light to an imaging unit of the solid-state imaging device; and a signal processing circuit which processes output signals of the solid-state imaging device. Here, the solid-state imaging device is the one with the above configuration according to the embodiment of the present invention.

According to the solid-state imaging device of the embodiment of this invention, it is possible to reduce the overlapping of the color filters at the pixel border in a first pixel combination which is constituted by at least green pixels, reduce the non-effective regions, and thereby enhance sensitivity.

According to the manufacturing method of the solid-state imaging device of the embodiment of the present invention, it is possible to manufacture the solid-state imaging device which can reduce the overlapping of the color filters at the pixel border in a first pixel combination which is constituted by at least green pixels, reduce the non-effective regions, and thereby enhance sensitivity.

According to the solid-state imaging device which constitutes the camera of the embodiment of this invention, it is possible to reduce the overlapping of the color filters at the pixel border in a first pixel combination which is constituted by at least green pixels, reduce the non-effective regions, and thereby enhance sensitivity.

BRIEF DESCRIPTION OF THE DRAWINGS

FIG. 11 is a plan view illustrating a layout of pixels according to a first working example of the present invention;

FIG. 12 is a plan view illustrating a layout of pixels according to a second working example of the present invention;

FIG. 13 is a plan view illustrating a layout of pixels according to a third working example of the present invention;

FIG. 14 is a plan view illustrating a layout of pixels according to a fourth working example of the present invention.

DESCRIPTION OF THE PREFERRED EMBODIMENTS

Hereinafter, the description will be made of the solid-state imaging device, the manufacturing method thereof, and the camera which includes the solid-state imaging device according to the embodiments of the present invention with reference to the accompanying drawings.

In this regard, the description will be made in the following order: 1. First Embodiment (Configuration in Which Two Green Pixels Are Arranged Both in Horizontal and Vertical Directions and Total of Four Green Pixels Are Arranged) 2. First Modified Example 3. Second Modified Example 4. Second Embodiment (Configuration in Which Each of Green, Blue, and Red Pixels Are Arranged by Two Both in Horizontal and Vertical Directions and Total of Four of Respective Color Pixels Are Arranged) 5. Third Embodiment (Configuration in Which a Floating Diffusion Is Shared Between Pixels) 6. Fourth Embodiment (Configuration of Upper Layer Wiring) 7. Fifth Embodiment (Configuration in Which Pluralities of Green Pixels Are Arranged in First and Second Directions) 8. First Working Example 9. Second Working Example 10. Third Working Example 11. Fourth Working Example 12. Sixth Embodiment (Camera Employing Solid-State Imaging Device)

First Embodiment

[Overall Configuration of Solid-State Imaging Device]

Figure 1A:
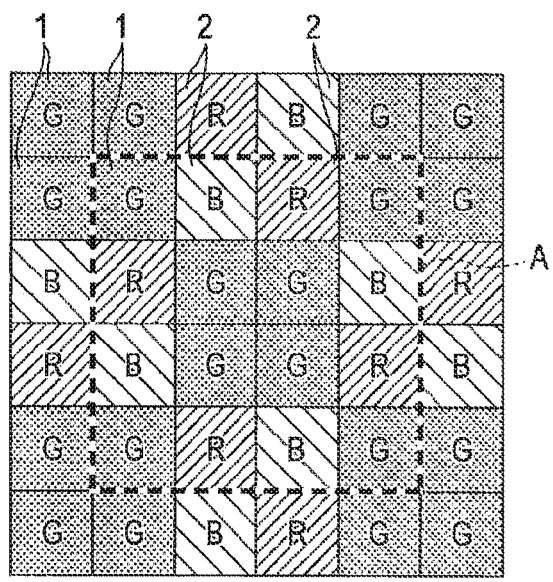
FIGS. 1A and 1B are plan views illustrating a layout of pixels and on-chip lenses of a solid-state imaging device according to a first embodiment of the present invention.

FIG. 1A is a plan view illustrating a pixel layout of the solid-state imaging device according to this embodiment.

In the solid-state imaging device according to this embodiment, photodiodes are formed separately for each pixel arranged on a light sensing surface of a semiconductor substrate in a matrix shape. In addition, a signal reading unit for reading a signal charge generated and charged in the photodiodes and a voltage in accordance with the signal charge is formed on the semiconductor substrate. Moreover, an insulating film including an optical waveguide is formed on the semiconductor substrate so as to cover the photodiode, a color filter is formed on the insulating film, and an on-chip lens is formed on the color filter.

[Layout of Color Filters and On-Chip Lenses]

The layout shown in FIG. 1A is an example of the layout of the color filters.

That is, there are first pixel combinations 1 and second pixel combinations 2. The first pixel combination 1 includes a configuration in which two green pixels (G) are arranged both in the horizontal and vertical directions and a total of four green pixels are arranged while provided with a green color filter. The second pixel combination 2 has configuration in which two pixels are arranged both in the horizontal and vertical directions and a total of four pixels are arranged, and two red pixels (R) having red color filters and two blue pixels (B) having blue color filters are arranged cater cornered. In the layout, these first pixel combinations 1 and the second pixel combinations 2 are alternately arranged both in the horizontal and vertical directions.

The layout shown in FIG. 1A can be also understood as a configuration in which the pixel layout surrounded by the broken line A is repeatedly arranged both in the horizontal and vertical directions.

Figure 1B:
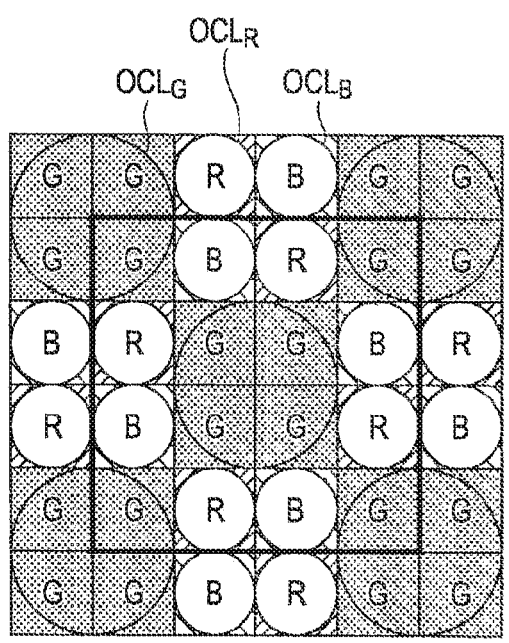

FIG. 1B is a plan view illustrating the pixel layout and an on-chip lens layout of the solid-state imaging device according to this embodiment. As described above, in the solid-state imaging device according to this embodiment, an on-chip lens is formed on the color filter.

As shown in FIG. 1B, one on-chip lens OCL.sub.Gis formed with respect to the first pixel combination 1 as the on-chip lens.

In addition, one on-chip lens (OCL.sub.B or OCL.sub.R) is formed with respect to each pixel of the second pixel combination 2 as the on-chip lens. The diameter of one on-chip lens (OCL.sub.B or OCL.sub.R) for each pixel of the second pixel combination 2 is different from the diameter of one on-chip lens OCL.sub.G for the first pixel combination 1.

Alternatively, one on-chip lens may be formed for each pixel of the first pixel combination 1 in the same manner as in the second pixel combination 2.

[Layer Configuration of Solid-State Imaging Device]

Figure 2A:
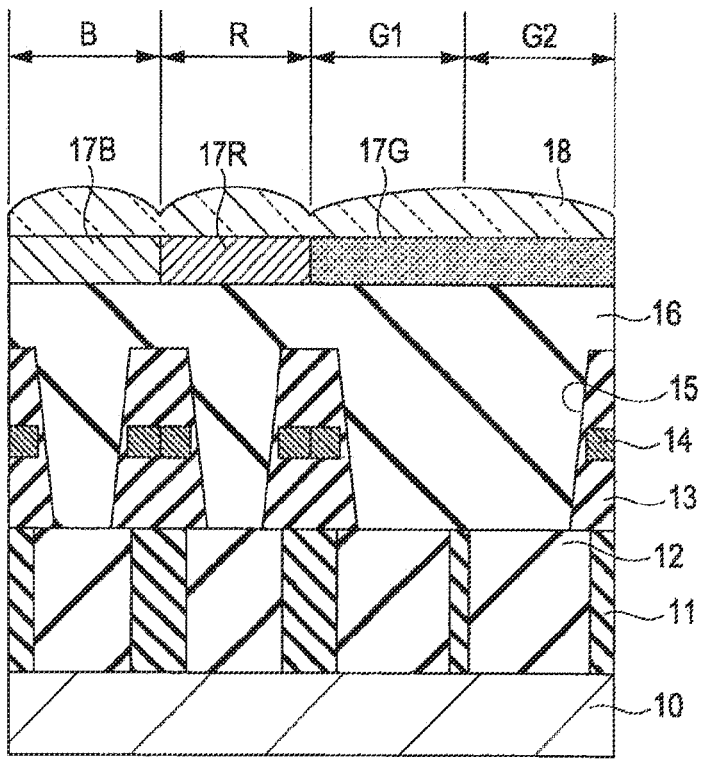
FIGS. 2A and 2B are schematic sectional views of the solid-state imaging device according to the first embodiment of the present invention.
Figure 2B:
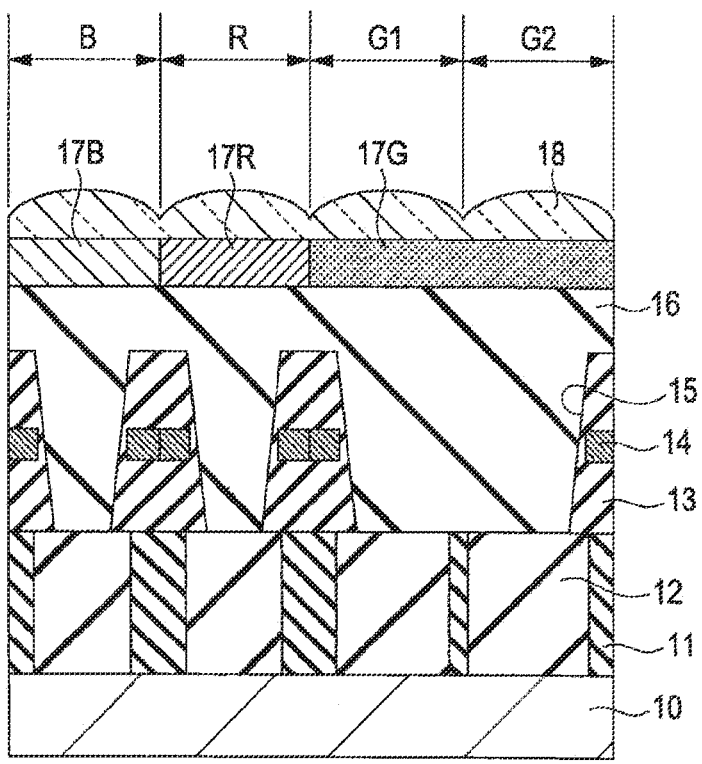

FIGS. 2A and 2B are schematic sectional views of the solid-state imaging device according to this embodiment. These drawings show the sectional views taken along the line crossing over the two green pixels (G1, G2), one blue pixel B, and one red pixel R.

FIG. 2A shows the case in which one on-chip lens is formed for the first pixel combination 1.

In the solid-state imaging device according to this embodiment, separation insulating films 11 for separating the pixels are formed on the semiconductor substrate 10, and semiconductor regions 12 including photodiodes are formed in the area separated by the separation insulating films 11. As described above, the pixels are arranged and formed in the matrix shape on the light sensing surface of the semiconductor substrate.

In addition, a signal reading unit (not shown) for reading a signal charge generated and charged in the photodiodes and voltage in accordance with the signal charge is formed on the semiconductor substrate. This is constituted by a MOS transistor, which is known as a floating diffusion and a source follower in the CMOS image sensor. In addition, this is constituted by a CCD channel in the CCD image sensor.

A first insulating film 13 is formed on the semiconductor substrate so as to cover the photodiodes. Conductive layers 14 which constitute the upper layer wiring are embedded in the first insulating film 13 above the region where the separation insulating films 11 are formed.

In addition, openings 15 are formed in the first insulating film 13 above the photodiodes. Second insulating film 16 is formed so as to fill in the openings 15.

The second insulating film 16 is made by a material with a higher refractive index than that of the first insulating film 13. For example, the first insulating film 13 is made by oxide silicon, silicon nitride, silicon carbide, and the laminated body thereof. The second insulating film 16 is made by a resin with a high refractive index such as siloxane resin or polyimide, and preferably made by siloxane resin.

In addition, the above-described resin contains metal oxides particles such as titanium oxide, tantalum oxide, niobium oxide, tungsten oxide, zirconium oxide, zinc oxide, indium oxide, or hafnium oxide, which increases the refractive index.

With the above configuration in which the insulating film with a high refractive index (the second insulating film 16) is embedded in the openings 14 of the insulating film with a low refractive index (the first insulating film 12), the optical waveguide for guiding the incident light from the upper direction is formed.

The color filters (17B, 17G, 17R) are formed on the insulating films (12, 16), and the on-chip lens 18 is formed on the color filters (17B, 17G, 17R). As shown in FIG. 2A, one on-chip lens 18 is formed for each first pixel combination 1 constituted by the green pixels (G1, G2) and the like.

Here, as shown in FIG. 2A, one optical waveguide is formed for each first pixel combination 1 as the optical waveguide for the green pixels (G1, G2).

For example, with regard to the optical waveguides, one optical waveguide is formed for each pixel of the second pixel combination 2, and one opening size of the optical waveguide for each pixel of the second pixel combination 2 is different from that of the optical waveguide for the first pixel combination 1.

On the other hand, FIG. 2B shows the case in which one on-chip lens is formed for each pixel of the first pixel combination 1.

This case is different from the one shown in FIG. 2A in that one on-chip lens is formed for each of the green pixels (G1, G2). Other configurations are substantially the same as that shown in FIG. 2A.

[Configuration of Color Filters]

Figure 3A:
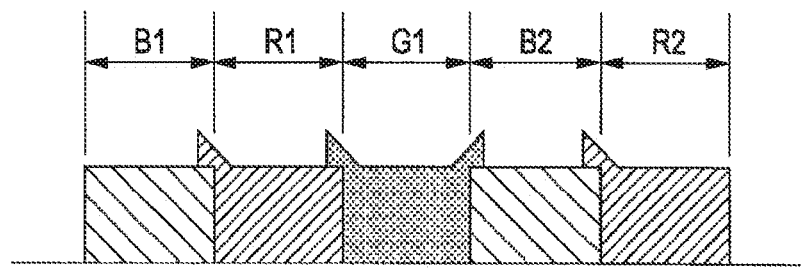
FIGS. 3A and 3B are sectional views illustrating the configuration of the color filters according to the first embodiment of the present invention.
Figure 3B:
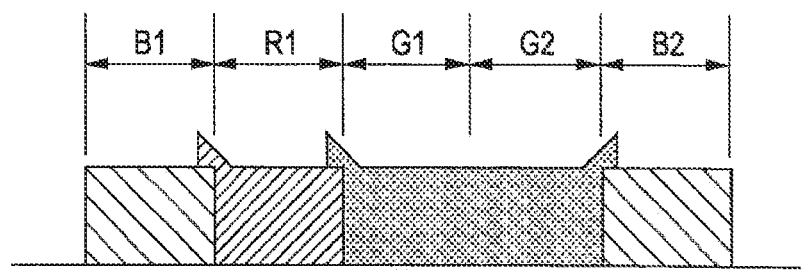

FIGS. 3A and 3B are schematic views illustrating the configuration of the color filters according to this embodiment.

FIG. 3A shows the sectional view of the color filters of the solid-state imaging device in the related art, and the sectional view taken along the line crossing over two blue pixels (B1, B2), two red pixels (R1, R2), and one green pixel G1.

The color filters of the green pixel G1 and the blue pixel B2 are overlapped with each other, the color filters of the green pixel G1 and the red pixel R1 are overlapped with each other, and these overlapping portions become non-effective regions. Here, the positional (upper and lower) relationships in the overlapping portions depend on the order in which the color filters are formed. The color filters are formed such that parts thereof are overlapped with each other at the border area of the pixels, which results in the above-described configuration.

On the other hand, FIG. 3B shows a sectional view of the color filters of the solid-state imaging device according to this embodiment, and the sectional view taken along the line crossing over two blue pixels (B1, B2), two green pixels (G1, G2), and one red pixel R1.

As described above, the color filter according to this embodiment includes the first pixel combination 1 in which four green pixels are adjacently arranged. Therefore, there is no overlapping portion of the color filters in the first pixel combination 1, and thereby it is possible to reduce the area of the non-effective region and enhance sensitivity.

Particularly, the green light is a light in a region for which people's eyes have high sensitivity. Therefore, it is possible to enhance luminance data of the obtained image data by improving the sensitivity of the green pixels.

As described above, one optical waveguide is formed for each first pixel combination 1 as the optical waveguide of the green pixels. With this configuration, it is possible to secure large opening sizes of the optical waveguides, and enhance the light collection effect.

[Manufacturing Method of Solid-State Imaging Device]

First, the photodiodes are formed separately for each of the pixels which are arranged in the matrix shape on the light sensing surface of the semiconductor substrate and the signal reading unit for reading the signal charge generated and charged in the photodiodes and the voltage in accordance with the signal charge. Next, the insulating film including the optical waveguides is formed on the semiconductor substrate so as to cover the photodiodes. Then, the color filters are formed on the insulating film, and the on-chip lenses are formed on the color filters.

Here, in the step of forming the color filters, the layout having the first pixel combinations 1 and the second pixel combinations 2 is employed. In the first pixel combination 1, two green pixels are arranged both in the horizontal and vertical directions, and a total of four green pixels are arranged while provided with a green color filter. In the second pixel combination 2, two pixels are arranged both in the horizontal and vertical directions, and a total of four pixels are arranged. In addition, two red pixels having red color filters and two blue pixels having blue color filters are arranged cater cornered. The layout in which the first pixel combinations 1 and the second pixel combinations 2 are alternately arranged both in the horizontal and vertical directions is employed.

As described above, four adjacent green pixels constitute the first pixel combination 1, and no overlapping portion comes about in the first pixel combination 1. Accordingly, it is possible to manufacture the solid-state imaging device capable of reducing the area of the non-effective regions and enhancing sensitivity.

Particularly, it is possible to secure the large opening sizes of the optical waveguides and thereby to enhance the light collection effect by forming one optical waveguide for each first pixel combination 1 as the optical waveguide for the green pixels.

First Modified Example

[Layout of Color Filters and On-Chip Lenses]

Figure 4A:
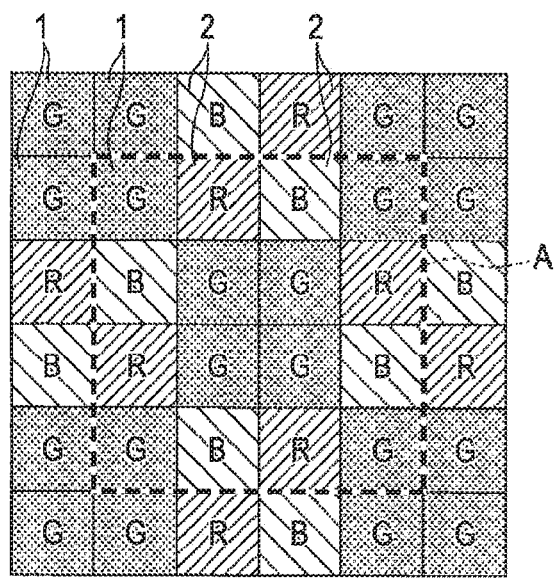
FIGS. 4A and 4B are plan views illustrating a layout of pixels and on-chip lenses of a solid-state imaging device according to a first modified example of the present invention.

FIG. 4A is a plan view illustrating the pixel layout of the solid-state imaging device according to this modified example. The solid-state imaging device according to this modified example is substantially the same as that of the first embodiment except that the positions of the red pixels (R) having the red color filters are switched with the positions of the blue pixels (B) having the blue color filters.

That is, the pixel layout includes the first pixel combinations 1 and the second pixel combinations 2. In the first pixel combination 1, two green pixels (G) are arranged both in the horizontal and vertical directions, and a total of four pixels are arranged while provided with a green color filter. In the second pixel combination 2, two pixels are arranged both in the horizontal and vertical directions, a total of four pixels are arranged, and two red pixels (R) having the red color filters and two blue pixels (B) having the blue color filters are arranged cater cornered. These first pixel combinations 1 and second pixel combinations 2 are alternately arranged in both the horizontal and vertical directions in the layout.

The layout shown in FIG. 4A can be also understood as a configuration in which the pixel layout surrounded by the broken line A is repeatedly arranged both in the horizontal and vertical directions.

Figure 4B:
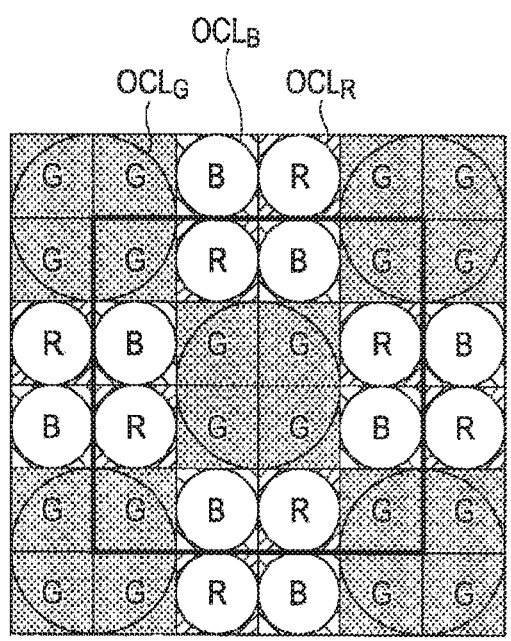

FIG. 4B is a plan view illustrating the pixel layout and the on-chip lens layout of the solid-state imaging device according to this modified example. In the solid-state imaging device according to this modified example, the on-chip lenses are formed on the color filters.

One on-chip lens OCL.sub.G is formed for the first pixel combination 1 as the above-described on-chip lens as shown in FIG. 4B.

In addition, one on-chip lens (OCL.sub.B or OCL.sub.R) is formed for each pixel of the second pixel combination 2 as the on-chip lens. The diameter of one on-chip lens (OCL.sub.B or OCL.sub.R) for each pixel of the second pixel combination 2 is different from that of one on-chip lens OCL.sub.G for the first pixel combination 1.

In addition, as the optical waveguide for the green pixel (G), one optical waveguide is formed for each first pixel combination 1.

On the other hand, as the optical waveguide, one optical waveguide is formed for each pixel of the second pixel combination 2, and one opening size of the optical waveguide for each pixel of the second pixel combination 2 is different from that of the optical waveguide for the first pixel combination 1.

As described above, according to the color filter of this modified example, four adjacent green pixels constitute the first pixel combination 1, and no overlapping portion comes about in the first pixel combination 1. Accordingly, it is possible to reduce the area of the non-effective regions and enhance sensitivity.

Particularly, the green light is a light in a region for which people's eyes have high sensitivity. Therefore, it is possible to enhance luminance data of the obtained image data by improving the sensitivity of the green pixels.

In addition, one optical waveguide is formed for each first pixel combination 1 as the optical waveguide of the green pixels. With this configuration, it is possible to secure large opening sizes of the optical waveguides, and enhance the light collection effect.

Second Modified Example

[Layout of Color Filters and On-Chip Lenses]

Figure 5A:
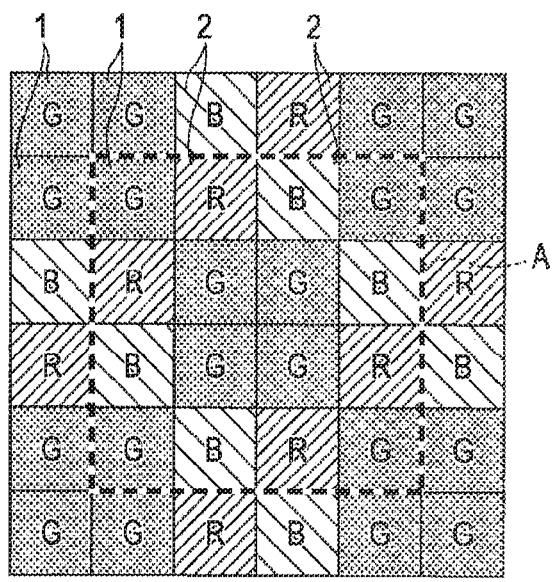
FIGS. 5A and 5B are plan views illustrating a layout of pixels and on-chip lenses of a solid-state imaging device according to a second modified example of the present invention.

FIG. 5A is a plan view illustrating the pixel layout of the solid-state imaging device according to this modified example.

The solid-state imaging device according to this modified example is substantially the same as that of the first embodiment except that the positions of the red pixels (R) having the red color filters are switched with the positions of the blue pixels (B) having the blue color filters.

That is, the pixel layout includes the first pixel combinations 1 and the second pixel combinations 2. In the first pixel combination 1, two green pixels (G) are arranged both in the horizontal and vertical directions, and a total of four pixels are arranged while provided with a green color filter. In the second pixel combination 2, two pixels are arranged both in the horizontal and vertical directions, a total of four pixels are arranged, and two red pixels (R) having the red color filters and two blue pixels (B) having the blue color filters are arranged cater cornered. These first pixel combinations 1 and second pixel combinations 2 are alternately arranged in both the horizontal and vertical directions in the layout.

The portions where the positions of the red pixels (R) are switched with the positions of the blue pixels (B) correspond to part of the layout according to the first embodiment. As shown in FIG. 5A, the red pixels (R) and the blue pixels (B) are respectively arranged cater cornered.

The layout shown in FIG. 5A can be also understood as a configuration in which the pixel layout surrounded by the broken line A is repeatedly arranged both in the horizontal and vertical directions.

Figure 5B:
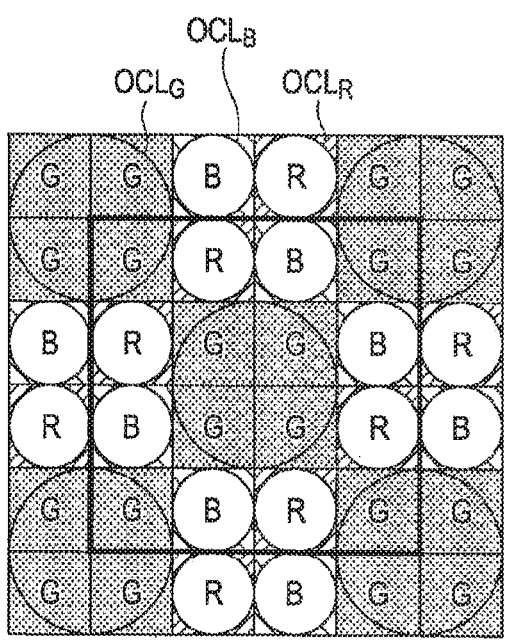

FIG. 5B is a plan view illustrating the pixel layout and the on-chip lens layout of the solid-state imaging device according to this modified example. In the solid-state imaging device according to this modified example, the on-chip lenses are formed on the color filters.

One on-chip lens OCL.sub.G is formed for the first pixel combination 1 as the above-described on-chip lens as shown in FIG. 5B.

In addition, one on-chip lens (OCL.sub.B or OCL.sub.R) is formed for each pixel of the second pixel combination 2 as the on-chip lens. The diameter of one on-chip lens (OCL.sub.B or OCL.sub.R) for each pixel of the second pixel combination 2 is different from that of one on-chip lens OCL.sub.G for the first pixel combination 1.

In addition, as the optical waveguide for the green pixel (G), one optical waveguide is formed for each first pixel combination 1.

On the other hand, as the optical waveguide, one optical waveguide is formed for each pixel of the second pixel combination 2, and one opening size of the optical waveguide for each pixel of the second pixel combination 2 is different from that of the optical waveguide for the first pixel combination 1.

As described above, according to the color filter of this modified example, four adjacent green pixels constitute the first pixel combination 1, and no overlapping portion comes about in the first pixel combination 1. Accordingly, it is possible to reduce the area of the non-effective regions and enhance sensitivity.

Particularly, the green light is a light in a region for which person's eyes have high sensitivity. Therefore, it is possible to enhance luminance data of the obtained image data by improving the sensitivity of the green pixels.

In addition, one optical waveguide is formed for each first pixel combination 1 as the optical waveguide of the green pixels. With this configuration, it is possible to secure large opening sizes of the optical waveguides, and enhance the light collection effect.

Second Embodiment

[Layout of Color Filters and On-Chip Lenses]

Figure 6A:
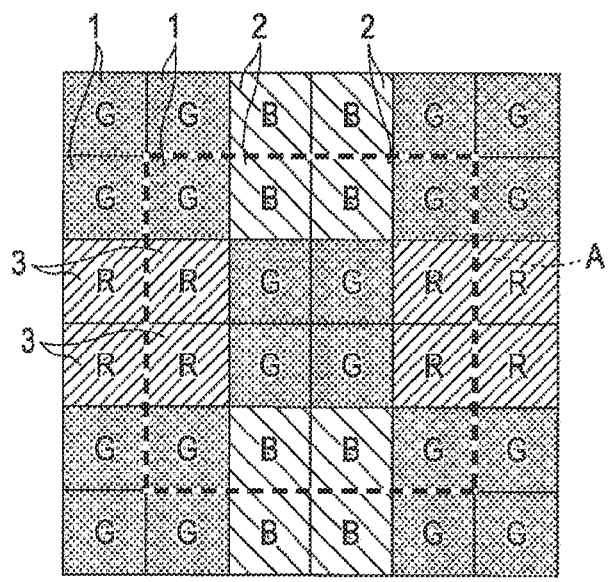
FIGS. 6A and 6B are plan views illustrating a layout of pixels and on-chip lenses of a solid-state imaging device according to a second embodiment of the present invention.

FIG. 6A is a plan view illustrating the pixel layout of the solid-state imaging device according to this embodiment.

The solid-state imaging device according to this embodiment is substantially the same as that of the first embodiment except for the configurations of the color filters, the on-chip lenses, and the optical waveguides.

The layout of the pixels provided with the color filters includes the first pixel combinations 1, the second pixel combinations 2, and the third pixel combinations 3. In the first pixel combination 1, two green pixels are arranged both in the horizontal and vertical directions, and total of four pixels are arranged while provided with a green color filter. In the second pixel combination 2, two blue pixels are arranged both in the horizontal and vertical directions, and a total of four pixels are arranged while provided with a blue color filter. In the third pixel combination 3, two red pixels are arranged both in the horizontal and vertical directions, and a total of four pixels are arranged while provided with a red color filter. Here, the fourth pixel combination 4 is configured such that the first pixel combinations 1 and the second pixel combinations 2 are alternately arranged in the horizontal direction. In addition, the fifth pixel combination 5 is configured such that the first pixel combinations 1 and the third pixel combinations 3 are alternately arranged in the horizontal direction. In this layout, the fourth pixel combinations 4 and the fifth pixel combinations 5 are alternately arrange in the vertical direction so as to shift by the amount of the first pixel combination 1 in the horizontal direction.

The layout shown in FIG. 6A can be also understood as a configuration in which the pixel layout surrounded by the broken line A is repeatedly arranged both in horizontal and vertical directions.

Figure 6B:
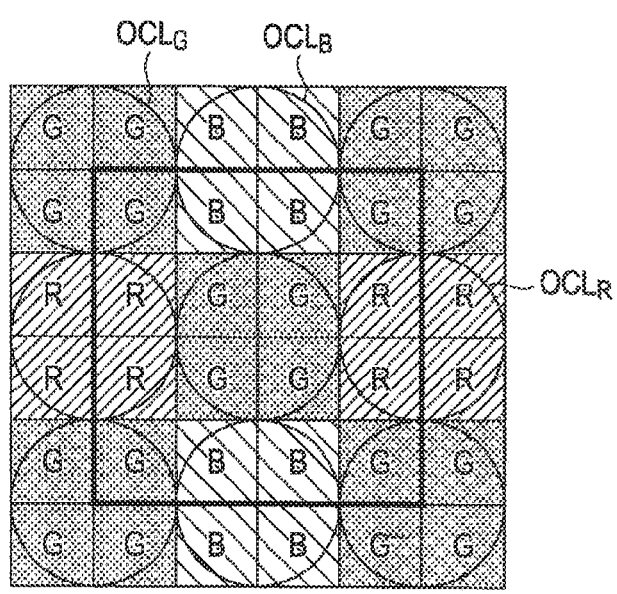

FIG. 6B is a plan view illustrating the pixel layout and the on-chip lens layout of the solid-state imaging device according to this embodiment. In the solid-state imaging device according to this embodiment, the on-chip lenses are formed on the color filters.

One on-chip lens OCL.sub.G is formed for the first pixel combination 1 as the on-chip lens as shown in FIG. 6B.

In addition, one on-chip lens (OCL.sub.B or OCL.sub.R) is formed for each of the second pixel combination 2 and the third pixel combination 3 as the on-chip lens. The diameter of one on-chip lens (OCL.sub.B or OCL.sub.R) for each of the second pixel combination 2 and the third pixel combination 3 is equal to that of one on-chip lens OCL.sub.G for the first pixel combination 1.

In addition, as the optical waveguide for the green pixel (G), one optical waveguide is formed for each first pixel combination 1.

As the optical waveguides, one optical waveguide is formed for each of the second pixel combination 2 and the third pixel combination 3, and one opening size of the optical waveguide for each of the second pixel combination 2 and the third pixel combination 3 is equal to that of the optical waveguide for the first pixel combination 1.

As described above, according to the color filter of this embodiment, four adjacent green pixels constitute the first pixel combination 1, and no overlapping portion of the color filters comes about in the first pixel combination 1. Accordingly, it is possible to reduce the area of the non-effective regions and enhance sensitivity. In addition, four adjacent blue pixels and four adjacent red pixels respectively constitute the second pixel combination 2 and the third pixel combination 3 in the same manner, and no overlapping portion of the color filters comes about in the second pixel combination 2 and the third pixel combination 3. Accordingly, it is possible to reduce the area of the non-effective regions and enhance sensitivity.

Particularly, the green light is a light in a region for which people's eyes have high sensitivity. Therefore, it is possible to enhance luminance data of the obtained image data by improving the sensitivity of the green pixels.

In addition, one optical waveguide is formed for each of the first pixel combination 1, the second pixel combination 2, and the third pixel combination 3, as the optical waveguides of the green pixels, blue pixels and the red pixels. With this configuration, it is possible to secure large opening sizes of the optical waveguides, and enhance the light collection effect.

[Manufacturing Method of Solid-State Imaging Device]

First, the photodiodes are formed separately for each of the pixels arranged in the matrix shape on the light sensing surface of the semiconductor substrate and the signal reading unit for reading the signal charge generated and charged in the photodiodes and the voltage in accordance with the signal charge. Next, the insulating film including the optical waveguides is formed on the semiconductor substrate so as to cover the photodiodes. Then, the color filters are formed on the insulating film, and the on-chip lenses are formed on the color filters.

Here, in the step of forming the color filters, the layout including the first, second, and third pixel combinations 1, 2, and 3 is employed. In the first pixel combination 1, two green pixels are arranged both in the horizontal and vertical directions as the color filters, and a total of four pixels are arranged while provided with a green color filter as their color filter. In the second pixel combination 2, two blue pixels are arranged both in the horizontal and vertical directions, and a total of four pixels are arranged while provided with a blue color filter. In the third pixel combination 3, two red pixels are arranged both in the horizontal and vertical directions, and a total of four pixels are arranged while provided with a red color filter. The fourth pixel combinations 4, in which the first pixel combinations 1 and the second pixel combinations 2 are alternately arranged in the horizontal direction, and the fifth pixel combinations 5, in which the first pixel combinations 1 and the third pixel combinations 3 are alternately arranged in the horizontal direction, are alternately arranged in the vertical direction so as to shift by the amount of the first pixel combination 1 in the horizontal direction.

In the step of forming the on-chip lenses, one on-chip lens is formed for each of the first, second, and third pixel combinations 1, 2, and 3 as the on-chip lenses.

As described above, four adjacent green pixels constitute the first pixel combination 1, and no overlapping portion comes about in the first pixel combination 1. Accordingly, it is possible to manufacture the solid-state imaging device capable of reducing the area of the non-effective regions and enhancing sensitivity. Particularly, since the adjacent blue pixels and the adjacent red pixels respectively form the second pixel combination 2 and the third pixel combination 3, no overlapping portion comes about in the second pixel combination 2 and the third pixel combination 3. Accordingly, it is possible to reduce the area of the non-effective regions and enhance sensitivity.

In addition, it is possible to secure the large opening sizes of the optical waveguides and thereby to enhance the light collection effect by forming one optical waveguide for each first pixel combination 1 as the optical waveguide for the green pixels. Moreover, it is possible to secure the large opening sizes of the optical waveguides and thereby to enhance the light collection effect by forming one optical waveguide for each four blue pixels and each four red pixels in the same manner.

Third Embodiment

[Configuration in which Floating Diffusion is Shared]

Figure 7A:
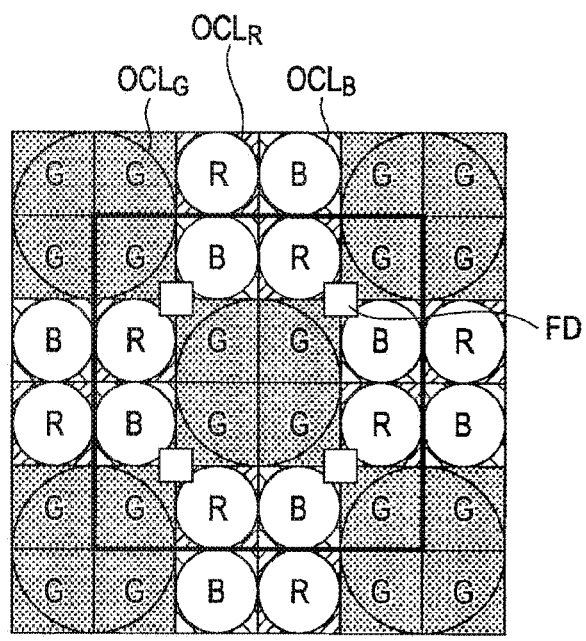
FIG. 7A is a plan view illustrating a layout of pixels and on-chip lenses of a solid-state imaging device according to a third embodiment of the present invention.

FIG. 7A is a plan view illustrating the pixel layout of the solid-state imaging device according to this embodiment.

The solid-state imaging device according to this embodiment is a CMOS image sensor.

The pixel layout and the on-chip lens layout are the same as those in the first embodiment. These may be the same as those in the first modified example, the second modified example, or the second embodiment.

The CMOS image sensor is provided with a MOS transistor which is called a floating diffusion and a source follower for each pixel, which will be described later. Here, in the configuration according to this embodiment, the circuits after the floating diffusion are shared by a plurality of pixels.

As shown in FIG. 7A, a floating diffusion FD is formed for a total of four pixels, that is, two green pixels G, one blue pixel B, and one red pixel R. The above four pixels are connected to the floating diffusion through respective transfer transistors. That is, the drawing shows the configuration in which one floating diffusion is shared by four pixels.

Figure 7B:
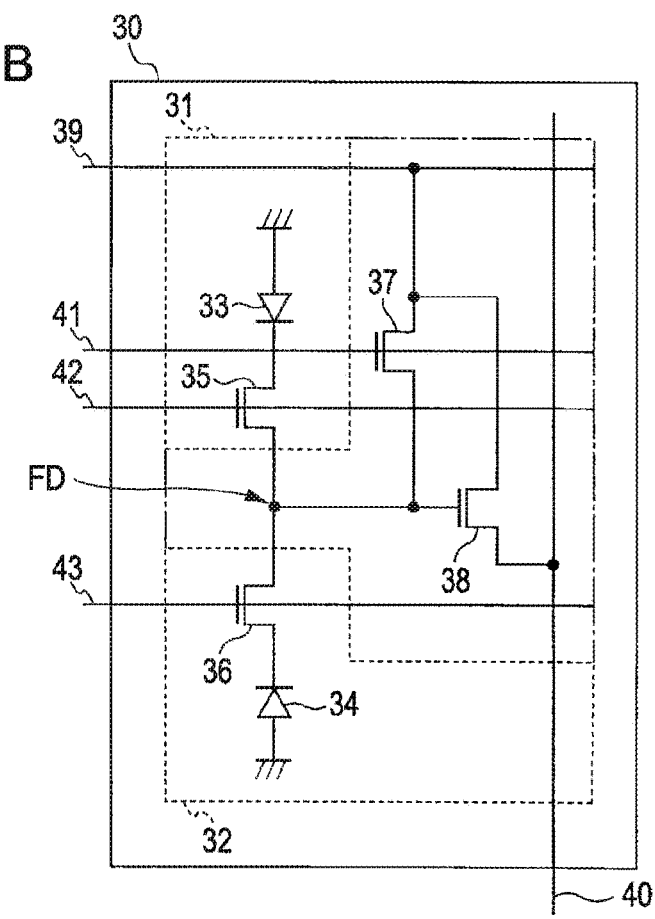
FIG. 7B is an equivalent circuit diagram of the pixels.

FIG. 7B is an equivalent circuit diagram of the pixels in the case where a floating diffusion is shared by a plurality of pixels in the solid-state imaging device according to this embodiment. FIG. 7B shows the case in which one floating diffusion is shared by two pixels.

For example, a photodiode 33 is formed in a pixel 31, and connected to the floating diffusion FD through a transfer transistor 35.

In the same manner, a photodiode 34 is formed in the other pixel 32, and connected to the floating diffusion FD through the transfer transistor 36.

Control lines (42, 43) connected to the gates of the transfer transistors (35, 36) controls the ON and OFF states of the respective transfer transistors (35, 36), and the signal charge charged in the photodiodes (33, 34) is transferred to the floating diffusion FD.

A gate electrode of an amplification transistor 38, which is called a source follower, is connected to the floating diffusion FD, and the output in accordance with the amount of the electric charge of the floating diffusion FD is output from an output line 40.

In addition, a reset transistor 37 is connected to the floating diffusion FD, and it is possible to remove and reset the signal charge from the floating diffusion after completing the reading by turning on and off the reset transistor 37.

In the above operations, by sequentially executing the transferring by the transfer transistor, the reading of the signal, and the resetting operation for each pixel, it is possible to obtain the signal of each pixel even if the floating diffusion is shared by a plurality of pixels.

[Layout of Photodiodes in Accordance with Sizes of On-Chip Lenses]

Figure 8:
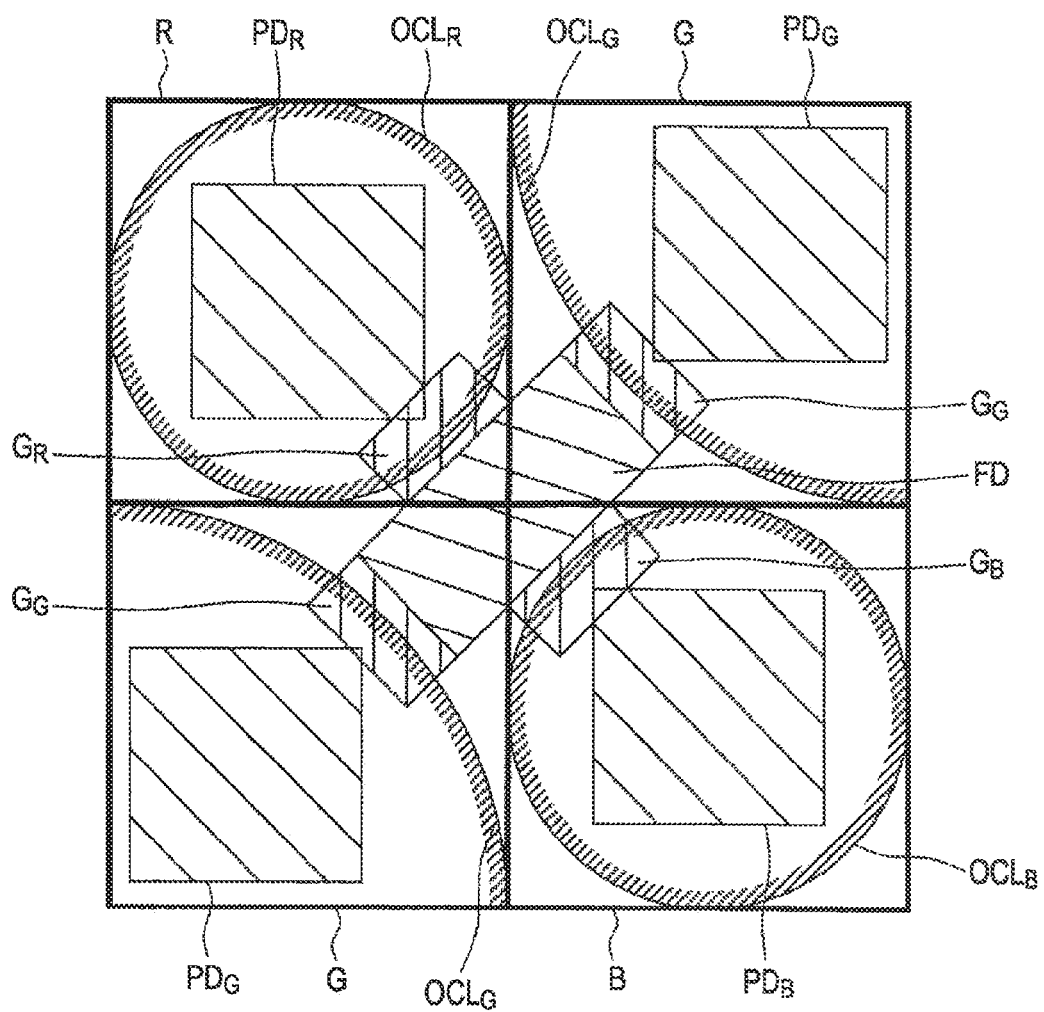
FIG. 8 is a plan view illustrating a layout of pixels and on-chip lenses of the solid-state imaging device according to the third embodiment of the present invention.

FIG. 8 is a plan view enlarging the four pixels shown in FIG. 7A, which are two green pixels G, one blue pixel B, and one red pixel R, and the floating diffusion FD formed so as to be surrounded by the four pixels. Each pixel is respectively provided with a photodiode (PD.sub.G, PD.sub.B, or PD.sub.R).

The photodiodes (PD.sub.G, PD.sub.B, PD.sub.R) are connected to the floating diffusion FD through the transfer transistors each having a transfer gate (G.sub.G, G.sub.B, or G.sub.R). One floating diffusion is shared by four pixels.

In the above configuration, the on-chip lens (OCL.sub.B or OCL.sub.R) is formed for each pixel of the blue pixel B and the red pixel R. On the other hand, one on-chip lens OCL.sub.G shared by a pixel combination constituted by four green pixels G is formed for the green pixels G. The on-chip lens has a light collection efficiency which is higher in the center portion thereof and becomes lower in the periphery portion thereof.

It is preferable that the photodiodes (PD.sub.B, PD.sub.R) for the blue pixel B and the red pixel R are respectively provided at the centers of the blue pixel B and the red pixel R.

On the other hand, the photodiodes PD.sub.G for the green pixels G are preferably provided not at the centers of the pixels but at the positions closer to the centers of the on-chip lenses OCL.sub.G as compared with the positions of the photodiodes (PD.sub.B, PD.sub.R) for the blue pixel B and the red pixel R as shown in FIG. 8.

When the positions of the photodiodes are different for each pixel as described above, it is preferable to employ in the layout, the floating diffusion FD with a form extending to the photodiodes PD.sub.G for the green pixels G as shown in FIG. 8. The transfer gates (G.sub.G, G.sub.B, G.sub.R) are formed in the regions between the floating diffusion FD with the above-described form and the respective photodiodes (PD.sub.G, PD.sub.B, PD.sub.R), and the transfer transistors are configured.

Other components are the same as those in the first embodiment. Alternatively, these may be the same as those in the first modified example, the second modified example, or the second embodiment.

As described above, according to the color filters of this embodiment, four adjacent green pixels constitute the first pixel combination 1, and no overlapping portion comes about in the first pixel combination 1. Accordingly, it is possible to reduce the area of the non-effective regions and enhance sensitivity. Particularly, the green light is a light in a region for which people's eyes have high sensitivity. Therefore, it is possible to enhance luminance data of the obtained image data by improving the sensitivity of the green pixels.

In addition, it is possible to secure the large opening sizes of the optical waveguides and thereby to enhance the light collection effect by forming one optical waveguide for each first pixel combination 1 as the optical waveguide for the green pixels.

Fourth Embodiment

[Configuration of Upper Layer Wiring]

Figure 9:
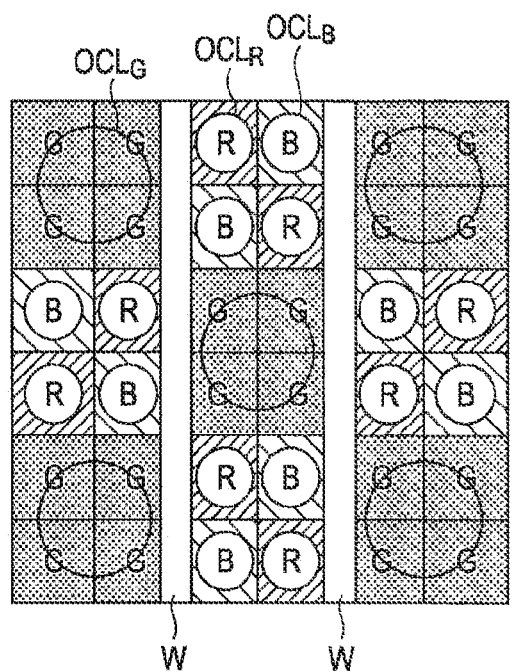
FIG. 9 is a plan view illustrating a layout of pixels and on-chip lenses of a solid-state imaging device according to a fourth embodiment of the present invention.

FIG. 9 is a plan view illustrating the pixel layout of the solid-state imaging device according to this embodiment.

The layout of the pixels and the on-chip lenses are the same as those in the first embodiment. Alternatively, these may be the same as those in the first modified example, the second modified example, or the second embodiment. In addition, when the solid-state imaging device is a CMOS image sensor, the configuration thereof may be the same as that in the third embodiment.

As shown in FIG. 2A of the first embodiment, the first insulating film 13 is formed on the semiconductor substrate so as to cover the photodiodes. The conductive layers 14 constituting the upper layer wiring are embedded in the first insulating film 13 above the region in which the separation insulating films 11 are formed.

The above conductive layer 14 is made of metal which does not transmit light or of polysilicon which has low light permeability. Accordingly, the light incident on the photodiodes for the pixels was not disturbed in the border portions between pixels according to the related art. According to this embodiment, however, four adjacent green pixels constitute the first pixel combination 1, and there is a possibility that the conductive layers disturb the light incident on the positions in which the conductive layers are provided so as to cross over the pixels in the first pixel combinations 1 even if the positions correspond to the border portions of the pixels.

Thus, according to this embodiment, the conductive layer W as the upper layer wiring is positioned so as not to cross over the pixels in each first pixel combination 1 as shown in FIG. 9. Specifically, the conductive layers are positioned in the border portions between the first pixel combinations 1 and the second pixel combinations 2.

With the above configuration, it is possible to reduce the possibility that the conductive layers W as the upper layer wirings disturb the light incident on the photodiodes.

Other components may be the same as those in each embodiment or each modified example.

Fifth Embodiment

[Configuration in which Pluralities of Green Pixels are Arranged in First and Second Directions]

Figure 10:
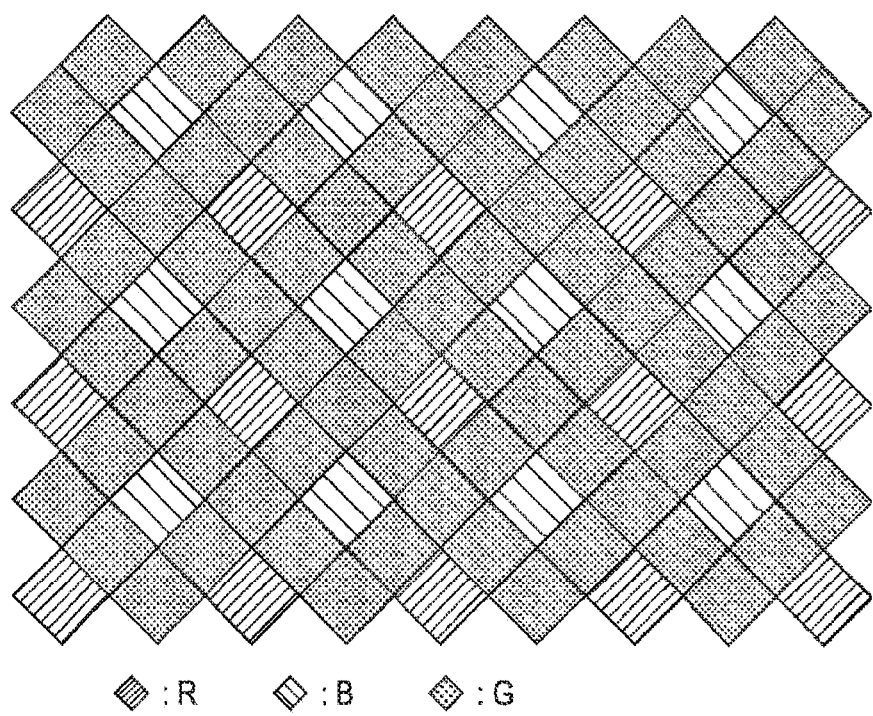
FIG. 10 is a plan view illustrating a layout of pixels of a solid-state imaging device according to a fifth embodiment of the present invention.

FIG. 10 is a plan view illustrating the pixel layout of the solid-state imaging device according to this embodiment.

The green pixels G, the blue pixels B, and the red pixels R are respectively arranged as shown in FIG. 10. Each pixel is arranged in the first and the second directions which are inclined by 45.degree. from the general horizontal and vertical directions.

Here, a plurality of green pixels G having green color filters are arranged both in the first and second directions as the color filters. The blue pixels B and the red pixels R are entirely surrounded by the green pixels G.

In addition, the on-chip lens shared by a plurality of green pixels is formed as the on-chip lens. The number of pixels may be any number as long as it is more than one. Moreover, the on-chip lens may be separated at appropriate positions.

In addition, the optical waveguide for the green pixels may be formed so as to be communicated with by a plurality of pixels.

According in the solid-state imaging device with the above-described layout, it is possible to enlarge the size of each pixel without degrading the quality of the obtained image data, and to thereby enhance sensitivity.

First Working Example

Figure 11:
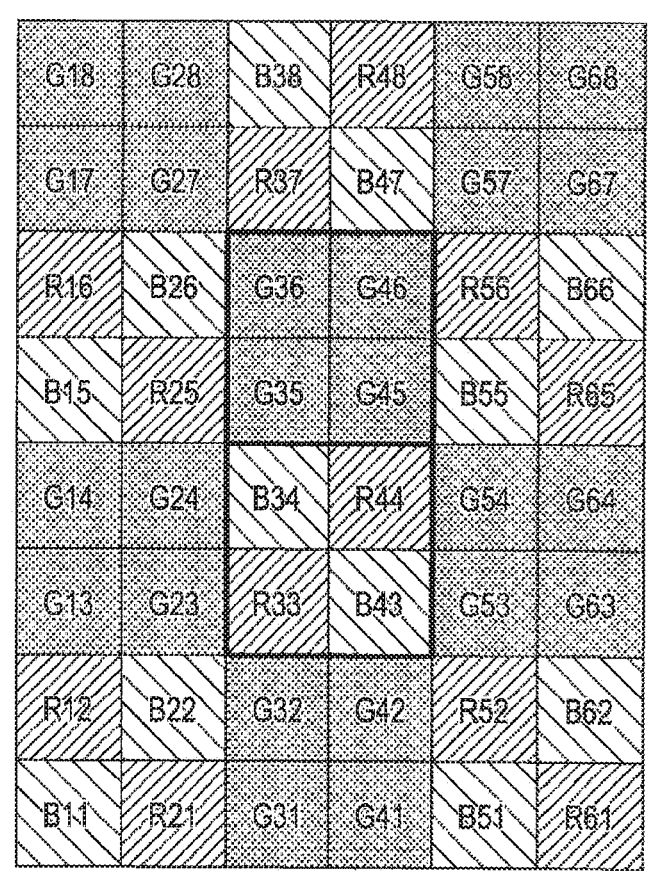

The solid-state imaging device including the pixels arranged in the layout shown in FIG. 11 is assumed while following the first embodiment.

In the layout shown in FIG. 11, the green pixels G, the blue pixels B, and the red pixels R are arranged in B11 to G68.

In the above configuration, the blue signals and the red signals in the green pixels G35, G36, G45, and G46 can be obtained by calculating from the data of the blue signals and the red signals of the pixels, which exist in the periphery of each pixel, as follows:

$R36=(R16+R56)/2, R46=(R44+R48)/2$ $B36=(B34+B38)/2, B46=(B26+B66)/2$ $R35=(R33+R37)/2, R45=(R25+R65)/2$ $B35=(B15+B55)/2, B45=(B43+B47)/2$ [Equation 1]

The green signals in the red pixels R33 and R44 and the blue pixels B34 and B43 can be obtained by calculating from the date of the green signals of the pixels, which exist in the periphery of each pixel.

$G34=(G14+G54+G32+G36)/4, G44=(G24+G64+G42+G46)/4$ $G33=(G13+G53+G31+G35)/4, G43=(G23+G63+G41+G45)/4$ [Equation 2]

Second Working Example

Figure 12:
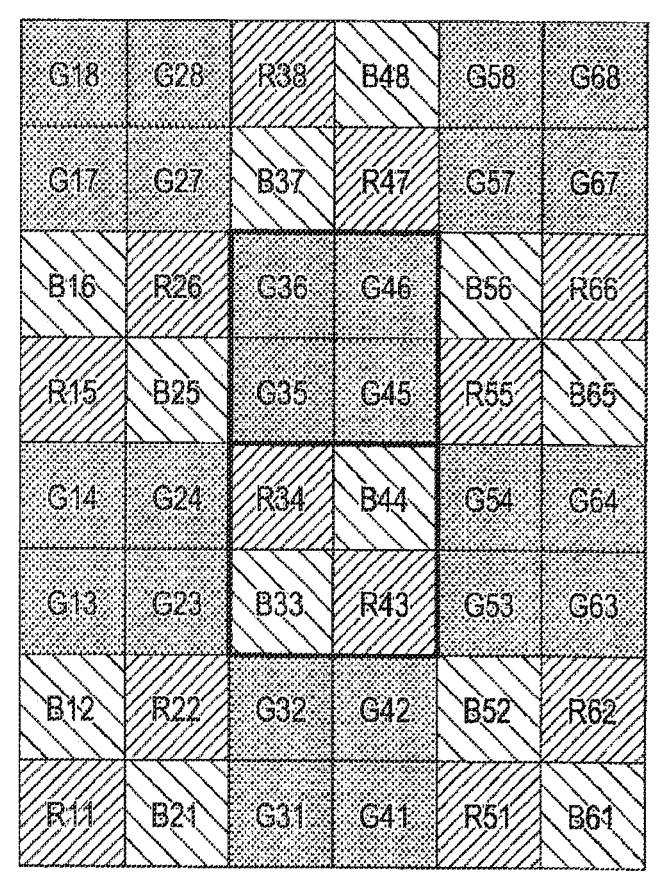

The solid-state imaging device including the pixels arranged in the layout shown in FIG. 12 is assumed while following the first modified example.

In the layout shown in FIG. 12, the green pixels G, the blue pixels B, and the red pixels R are arranged in R11 to G68.

In the above configuration, the blue signals and the red signals in the green pixels G35, G36, G45, and G46 can be obtained by calculating from the data of the blue signals and the red signals of the pixels, which exist in the periphery of each pixel, as follows:

$R36=(R34+R38)/2, R46=(R26+R66)/2$ $B36=(B16+B56)/2, B46=(B44+B48)/2$ $R35=(R15+R55)/2, R45=(R43+R47)/2$ $B35=(B33+B37)/2, B45=(B25+B65)/2$ [Equation 3]

In addition, the green signals in the blue pixels B33 and B44 and the red pixels R34 and R43 can be obtained by calculating from the data of the green signals of the pixels, which exist in the periphery of each pixel.

$G34=(G14+G54+G32+G36)/4, G44=(G24+G64+G42+G46)/4$ $G33=(G13+G53+G31+G35)/4, G43=(G23+G63+G41+G45)/4$ [Equation 4]

Third Working Example

Figure 13:
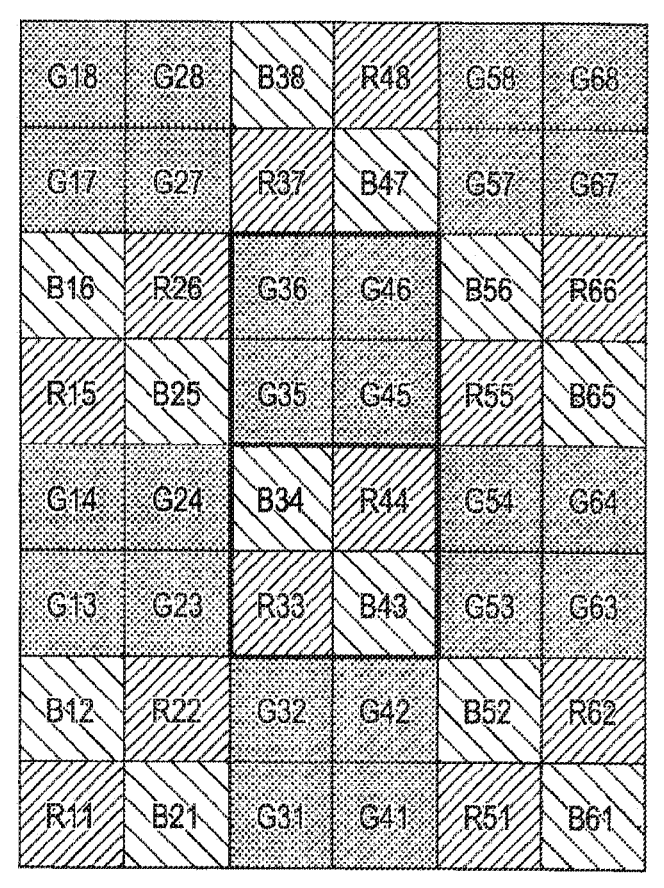

The solid-state imaging device including the pixels arranged in the layout shown in FIG. 13 is assumed while following the second modified example.

In the layout shown in FIG. 13, the green pixels G, the blue pixels B, and the red pixels R are arranged in R11 to G68.

In the above configuration, the blue signals and the red signals in the green pixels G35, G36, G45, and G46 can be obtained by calculating from the data of the blue signals and the red signals of the pixels, which exist in the periphery of each pixel, as follows:

$B36=(B25+B47)/2, R46=(R37+R55)/2$ $R35=(R26+R44)/2, B45=(B34+B56)/2$ [Equation 5]

In addition, the green signals in the red pixels R33 and R44 and the blue pixels B34 and B43 can be obtained by calculating from the data of the green signals of the pixels, which exist in the periphery of each pixel.

$G34=(G14+G54+G32+G36)/4, G44=(G24+G64+G42+G46)/4$ $G33=(G13+G53+G31+G35)/4, G43=(G23+G63+G41+G45)/4$ [Equation 6]

Fourth Working Example

Figure 14:
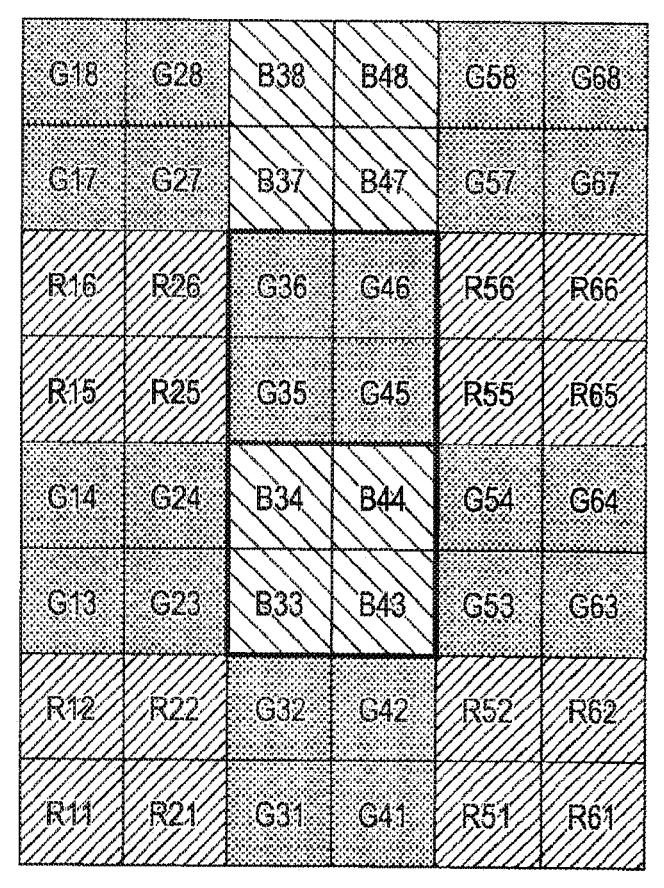

The solid-state imaging device including the pixels arranged in the layout shown in FIG. 14 is assumed while following the second embodiment.

In the layout shown in FIG. 14, the green pixels G, the blue pixels B, and the red pixels R are arranged in R11 to In the above configuration, the blue signals and the red signals in the green pixels G35, G36, G45, and G46 can be obtained by calculating from the data of the blue signals and the red signals of the pixels, which exist in the periphery of each pixel, as follows:

$R36=(R16+R56)/2, R46=(R44+R48)/2$ $B36=(B34+B38)/2, B46=(B26+B66)/2$ $R35=(R33+R37)/2, R45=(R25+R65)/2$ $B35=(B15+B55)/2, B45=(B43+B47)/2$ [Equation 7]

In addition, the green signals in the blue pixels B33, B34, B43 and B44 can be obtained by calculating from the data of the green signals of the pixels, which exist in the periphery of each pixel.

$G34=(G14+G54+G32+G36)/4, G44=(G24+G64+G42+G46)/4$ $G33=(G13+G53+G31+G35)/4, G43=(G23+G63+G41+G45)/4$ [Equation 6]

Sixth Embodiment

[Camera Employing Solid-State Imaging Device]

Figure 15:
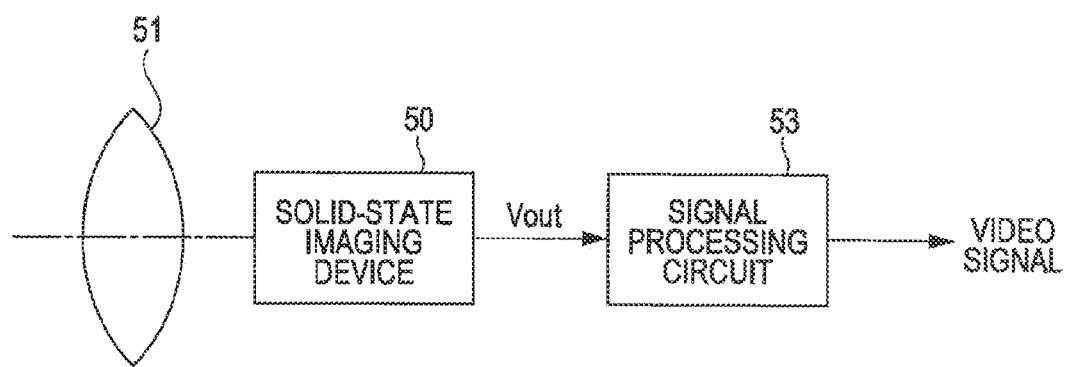
FIG. 15 is a schematic configuration diagram of a camera according to a sixth embodiment of the present invention.

FIG. 15 is a schematic configuration diagram of the camera according to this embodiment.

This camera is provided with a solid-state imaging device 50 in which a plurality of pixels are integrated, an optical system 51, and a signal processing circuit 53.

In this embodiment, the above solid-state imaging device 50 includes the solid-state imaging device according to any one of the first to fifth embodiments and the first and second modified examples.

The optical system 51 forms an image on the imaging surface of the solid-state imaging device 50 by the imaging light (incident light) from the object. As a result, the photodiode constituting each pixel on the imaging surface of the solid-state imaging device 50 converts the imaging light into the signal charge in accordance with the incident light amount, and charges the signal charge for a predetermined time period.

The charged signal charge is output as an output signal Vout through a CCD charge channel, for example.

The signal processing circuit 53 subjects the output signal Vout of the solid-state imaging device 50 to various signal processings, and outputs as a video signal.

According to the above-described camera of this embodiment, it is possible to improve the color shading characteristic and the dispersion characteristic without lowering the light collection ratio of the obliquely incident light and enhance sensitivity. Moreover, it is possible to form the microlens with a simple method and simple processes.

The embodiments of the present invention are not limited to the above description.

For example, the embodiments can be applied to both the CMOS sensor and the CCD element.

In addition, various modifications can be made without departing from the scope of the present invention.

The present application contains subject matter related to that disclosed in Japanese Priority Patent Application JP 2009-173127 filed in the Japan Patent Office on Jul. 24, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light detecting device, comprising:
a first on-chip lens;
a second on-chip lens;
a plurality of photoelectric conversion regions;
a single photoelectric conversion region;
a first waveguide disposed between the first on-chip lens and the plurality of photoelectric conversion regions; and
a second waveguide disposed between the second on-chip lens and the single photoelectric conversion region,
wherein the first on-chip lens has a larger diameter than the second on-chip lens.

2. The light detecting device according to claim 1, wherein the single photoelectric conversion region is disposed adjacent to one of the plurality of photoelectric conversion regions.

3. The light detecting device according to claim 1, wherein each of the first waveguide and the second waveguide comprises:
a first portion comprising a first material;
a second portion comprising a second material; and
a third portion comprising the first material,
wherein the second portion is disposed between the first portion and the third portion, and
wherein a refractive index of the first material is lower than a refractive index of the second material.

4. The light detecting device according to claim 3, further comprising a conductive layer disposed in the first material.

5. The light detecting device according to claim 3, wherein a planar area of the second portion of the first wave guide is larger than a planar area of the second portion of the second waveguide.

6. The light detecting device according to claim 3, wherein the second material comprises a resin containing metal oxide particles.

7. The light detecting device according to claim 1, further comprising:
a first color filter disposed between the first on-chip lens and the first waveguide; and
a second color filter disposed between the second on-chip lens and the second waveguide.

8. The light detecting device according to claim 7, wherein the first color filter is configured to transmit light of a first color, and wherein the second color filter is configured to transmit light of a second color different from the first color.

9. The light detecting device according to claim 8, wherein the first color is green and the second color is red or blue.

10. The light detecting device according to claim 1,
wherein the single photoelectric conversion region comprises a single photodiode, and
wherein the plurality of photoelectric conversion regions comprises a plurality of photodiodes.

11. The light detecting device according to claim 1,
wherein the plurality of photoelectric conversion regions comprises a first photoelectric conversion region and a second photoelectric conversion region, and
wherein the light detecting device further comprises an insulating portion between the first photoelectric conversion region and the second photoelectric conversion region.

12. The light detecting device according to claim 1, further comprising:
a third on-chip lens;
a second single photoelectric conversion region; and
a third waveguide disposed between the third on-chip lens and the second single photoelectric conversion region,
wherein the first on-chip lens has a larger diameter than the third on-chip lens.

13. The light detecting device according to claim 12, wherein the single photoelectric conversion region is disposed between the second single photoelectric conversion region and one of the plurality of photoelectric conversion regions.

14. The light detecting device according to claim 12, further comprising:
a green color filter disposed below the first on-chip lens;
a red color filter disposed below the second on-chip lens; and
a blue color filter disposed below the third on-chip lens.

15. The light detecting device according to claim 12, wherein the second on-chip lens and the third on-chip lens have a same diameter.

16. The method of claim 1, further comprising:
a third on-chip lens;
a second plurality of photoelectric conversion regions; and
a third waveguide disposed between the third on-chip lens and the second plurality of photoelectric conversion regions,
wherein the third on-chip lens has a larger diameter than the second on-chip lens.

17. The light detecting device of claim 16, further comprising:
a first green color filter disposed below the first on-chip lens;
a red color filter or a blue color filter disposed below the second on-chip lens; and
a second green color filter disposed below the third on-chip lens.

18. The light detecting device according to claim 1, further comprising a substrate disposed below the single photoelectric conversion region and the plurality of photoelectric conversion regions.

19. The light detecting device according to claim 18, wherein the substrate comprises a semi-conductor substrate.

20. A camera apparatus, comprising:
an optical system;
the light detecting device according to claim 10; and
a signal processing circuit.

* * * * *